United States Patent
Luan

(10) Patent No.: US 12,525,564 B2
(45) Date of Patent: Jan. 13, 2026

(54) INTEGRATED CIRCUIT CHIP PACKAGE THAT DOES NOT UTILIZE A LEADFRAME

(71) Applicant: STMicroelectronics PTE LTD, Singapore (SG)

(72) Inventor: Jing-En Luan, Singapore (SG)

(73) Assignee: STMicroelectronics PTE LTD, Singapore (SG)

( * ) Notice: Subject to any disclaimer, the term of this patent is extended or adjusted under 35 U.S.C. 154(b) by 472 days.

(21) Appl. No.: 18/081,248

(22) Filed: Dec. 14, 2022

(65) Prior Publication Data
US 2023/0245992 A1 Aug. 3, 2023

Related U.S. Application Data

(60) Provisional application No. 63/304,087, filed on Jan. 28, 2022.

(51) Int. Cl.
*H01L 23/00* (2006.01)
*H01L 21/56* (2006.01)
(Continued)

(52) U.S. Cl.
CPC ............ *H01L 24/24* (2013.01); *H01L 21/561* (2013.01); *H01L 21/565* (2013.01);
(Continued)

(58) Field of Classification Search
CPC ............ H01L 24/24; H01L 24/16; H01L 2224/73209; H01L 24/13; H01L 21/565;
(Continued)

(56) References Cited

U.S. PATENT DOCUMENTS 6,441,475 B2 8/2002 Zandman et al.
6,507,120 B2 1/2003 Lo et al.
(Continued)

FOREIGN PATENT DOCUMENTS

CN 109256375 A 1/2019
CN 109712952 A 5/2019
(Continued)

OTHER PUBLICATIONS

CN First Office Action and Search Report for counterpart CN Appl. No. 202310055889.2, report dated Aug. 12, 2025, 6 pgs.

*Primary Examiner* — Didarul A Mazumder
(74) *Attorney, Agent, or Firm* — Crowe & Dunlevy LLC

(57) ABSTRACT

An integrated circuit die includes a semiconductor substrate, an interconnect layer including bonding pads, and a passivation layer covering the interconnect layer and including openings at the bonding pads. A conductive redistribution layer including conductive lines and conductive vias is supported by the passivation layer. An insulating layer covers the conductive redistribution layer and the passivation layer. Channels formed in an upper surface of the insulating layer delimit pedestal regions in the insulating layer. A through via extends from an upper surface of each pedestal region through the pedestal region and the insulating layer to reach and make contact with a portion of the conductive redistribution layer. A metal pad is formed at the upper surface of each pedestal region in contact with its associated through via. The metal pads for leads of a quad-flat no-lead (QFN) type package.

14 Claims, 11 Drawing Sheets

(51) Int. Cl.
*H01L 23/498* (2006.01)
*H10D 84/03* (2025.01)

(52) U.S. Cl.
CPC ...... *H01L 21/568* (2013.01); *H01L 23/49805* (2013.01); *H01L 24/19* (2013.01); *H10D 84/038* (2025.01); *H01L 24/16* (2013.01); *H01L 24/73* (2013.01); *H01L 2224/16227* (2013.01); *H01L 2224/19* (2013.01); *H01L 2224/24011* (2013.01); *H01L 2224/2402* (2013.01); *H01L 2224/24051* (2013.01); *H01L 2224/24226* (2013.01); *H01L 2224/73209* (2013.01); *H01L 2924/182* (2013.01)

(58) Field of Classification Search
CPC .............. H01L 24/19; H01L 2224/19; H01L 2224/24226; H01L 24/20; H01L 23/3121; H01L 21/568; H01L 23/49805
USPC .................................. 257/786; 438/612, 666

See application file for complete search history.

(56) References Cited

U.S. PATENT DOCUMENTS

| | | | |
|---|---|---|---|
| 7,189,596 B1* | 3/2007 | Mu ..................... | H01L 23/4334 |
| | | | 438/126 |
| 7,274,098 B2 | 9/2007 | Tzu | |
| 7,432,130 B2 | 10/2008 | Ismail et al. | |
| 2009/0263939 A1* | 10/2009 | Sakamoto ............... | H01L 24/97 |
| | | | 438/126 |
| 2015/0084171 A1 | 3/2015 | Ma et al. | |
| 2015/0155248 A1* | 6/2015 | Lin ......................... | H01L 21/56 |
| | | | 257/737 |
| 2016/0056126 A1* | 2/2016 | Yu .......................... | H01L 24/14 |
| | | | 257/737 |
| 2016/0172329 A1* | 6/2016 | Chang ................... | H01L 23/293 |
| | | | 257/737 |
| 2018/0061794 A1 | 3/2018 | Kim et al. | |
| 2019/0131197 A1 | 5/2019 | Versiglia et al. | |
| 2022/0189788 A1* | 6/2022 | Luan ................... | H01S 5/02218 |

FOREIGN PATENT DOCUMENTS

| | | |
|---|---|---|
| CN | 111312681 A | 6/2020 |
| CN | 113921495 A | 1/2022 |
| CN | 219419027 U | 7/2023 |

* cited by examiner

INTEGRATED CIRCUIT CHIP PACKAGE THAT DOES NOT UTILIZE A LEADFRAME

CROSS REFERENCE TO RELATED APPLICATIONS

This application claims priority from U.S. Provisional Application for Patent No. 63/304,087, filed Jan. 28, 2022, the disclosure of which is incorporated herein by reference.

TECHNICAL FIELD

The present invention generally relates to the packaging of integrated circuit chips and, in particular, to an integrated circuit chip package that does not utilize a leadframe.

BACKGROUND

Reference is made to FIG. 1 which shows a cross-section of a conventional integrated circuit package 10 (for example, of a quad-flat no-lead (QFN) type). A leadframe 12 made, for example, of copper, includes a die pad 12a and a plurality of leads 12b which extend outwardly from the die pad 12a. An integrated circuit die 16 is mounted to an upper surface of the die pad 12a using an adhesive material. The integrated circuit die 16 includes a semiconductor (for example, silicon) substrate 16a and an interconnect layer 16b extending over the substrate 16a. The substrate 16a supports a plurality of integrated circuit devices such as transistors. The interconnect layer 16b includes a plurality of metallization layers which support interconnection lines and interconnection vias as well as a plurality of bonding pads 16c. Bonding wires 18 electrically connect the bonding pads 16c to the leads 12b. An encapsulation body 20 encapsulates the leadframe 12, integrated circuit die 16 and bonding wires 18.

SUMMARY

In an embodiment, an integrated circuit package without leadframe comprises: an integrated circuit die including: a semiconductor substrate having a front face; an interconnect layer extending over the front face of the semiconductor substrate; wherein the interconnect layer includes a plurality of bonding pads; and a passivation layer covering an upper surface of the interconnect layer and including openings at the bonding pads; a conductive redistribution layer supported by an upper surface of the passivation layer, said conductive redistribution layer including conductive lines extending on the passivation layer and conductive vias extending through the openings in the passivation layer to make contact to the bonding pads; an insulating layer covering the conductive redistribution layer and the passivation layer, wherein the insulating layer includes a plurality of channels formed in an upper surface thereof to delimit a plurality of pedestal regions in the insulating layer; a through via extending from an upper surface of the pedestal region through the pedestal region and the insulating layer to reach and make contact with a portion of the conductive redistribution layer; and a metal pad formed at the upper surface of the pedestal region and in contact with the through via.

In an embodiment, a method for forming an integrated circuit package without leadframe comprises: providing an integrated circuit including: a semiconductor substrate having a front face; an interconnect layer extending over the front face of the semiconductor substrate; wherein the interconnect layer includes a plurality of bonding pads; and a passivation layer covering an upper surface of the interconnect layer and including openings at the bonding pads; forming a conductive redistribution layer supported by an upper surface of the passivation layer, said conductive redistribution layer including conductive lines extending on the passivation layer and conductive vias extending through the openings in the passivation layer to make contact to the bonding pads; laminating a stack including an insulating layer and a metal layer over the conductive redistribution layer; forming a plurality of openings in the metal layer; extending the plurality of openings through the insulating layer to reach the conductive redistribution layer; plating to fill the plurality of openings with metal to form through vias; patterning the metal layer to form plurality of metal pads in contact with the through vias; and forming a plurality of channels in the insulating layer to define pedestal regions of the insulating layer at each metal pad.

In an embodiment, an integrated circuit package without leadframe comprises: an integrated circuit die having a front surface including a plurality of bonding pads and a passivation layer; a conductive redistribution layer over the passivation layer and in electrical connection to said plurality of bonding pads; an insulating layer over the conductive redistribution layer, wherein the insulating layer includes a plurality of channels that delimit a plurality of pedestal regions; a through via extending through each pedestal region to reach and make contact with the conductive redistribution layer; and a metal pad at an upper surface of each pedestal region and in contact with its through via.

In an embodiment, an integrated circuit package without leadframe comprises: an integrated circuit die having a front surface including a plurality of bonding pads and a passivation layer; an encapsulating body surrounding sides and a back surface of the integrated circuit die; a conductive redistribution layer over the passivation layer and in electrical connection to said plurality of bonding pads; an insulating layer over the conductive redistribution layer and the encapsulating body, wherein the insulating layer includes a plurality of channels that delimit a plurality of pedestal regions; a through via extending through each pedestal region to reach and make contact with the conductive redistribution layer; and a metal pad at an upper surface of each pedestal region and in contact with its through via.

BRIEF DESCRIPTION OF THE DRAWINGS

For a better understanding of the embodiments, reference will now be made by way of example only to the accompanying figures in which.

DETAILED DESCRIPTION

Figure 2:
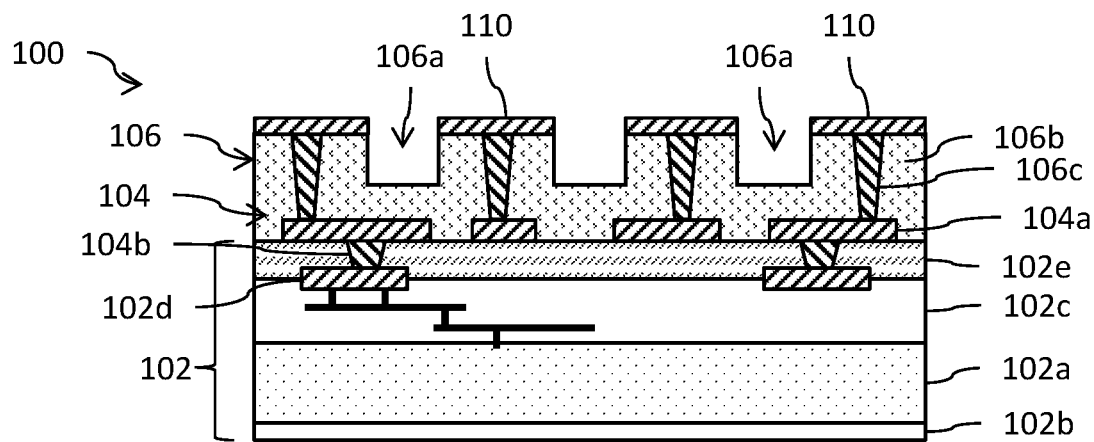
FIG. 2 shows a cross-sectional view of a chip-sized integrated circuit package that does not utilize a leadframe.

Reference is made to FIG. 2 shows a cross-sectional view of a chip-sized integrated circuit package 100 that does not utilize a leadframe. An integrated circuit die 102 includes a semiconductor (for example, silicon) substrate 102a having a front face and a rear face. The substrate 102a supports a plurality of integrated circuit devices such as transistors at the front face. An insulating coating layer 102b is mounted to the rear face. An interconnect layer 102c extends over the front face of the substrate 102a. The interconnect layer 102c includes a plurality of metallization layers which support interconnection lines and interconnection vias as well as a plurality of bonding pads 102d. A passivation layer 102e covers the upper surface of the interconnect layer 102c and includes openings which expose the bonding pads 102d. A conductive redistribution layer (RDL) 104 is supported by the upper surface of the passivation layer 102e. The RDL 104 includes conductive lines 104a extending on the passivation layer 102e and conductive vias 104b extending through the openings in the passivation layer 102e to make contact to the bonding pads 102d. A resin layer 106 covers the RDL 104 and the passivation layer 102e. The resin layer 106 includes a plurality of channels 106a formed in the upper (i.e., front) surface. In a preferred implementation, the depth of the channels 106a from the upper surface is less than the thickness of the resin layer 106 (however, it will be noted that in alternative embodiments the depth of the channels 106a may pass completely through the resin layer 106 to reach the upper surface of the passivation layer 102e). The channels 106a delimit a plurality of pedestal (or stand-off) regions 106b in the resin layer 106. Each pedestal region 106b includes a through via 106c extending from an upper surface of the pedestal region 106b to reach and make contact with a portion of the RDL 104 (for example, along one of the conductive lines 104a). A metal pad 110 is formed at the upper surface of each pedestal region 106b in contact with the associated through via 106c.

Figure 3:
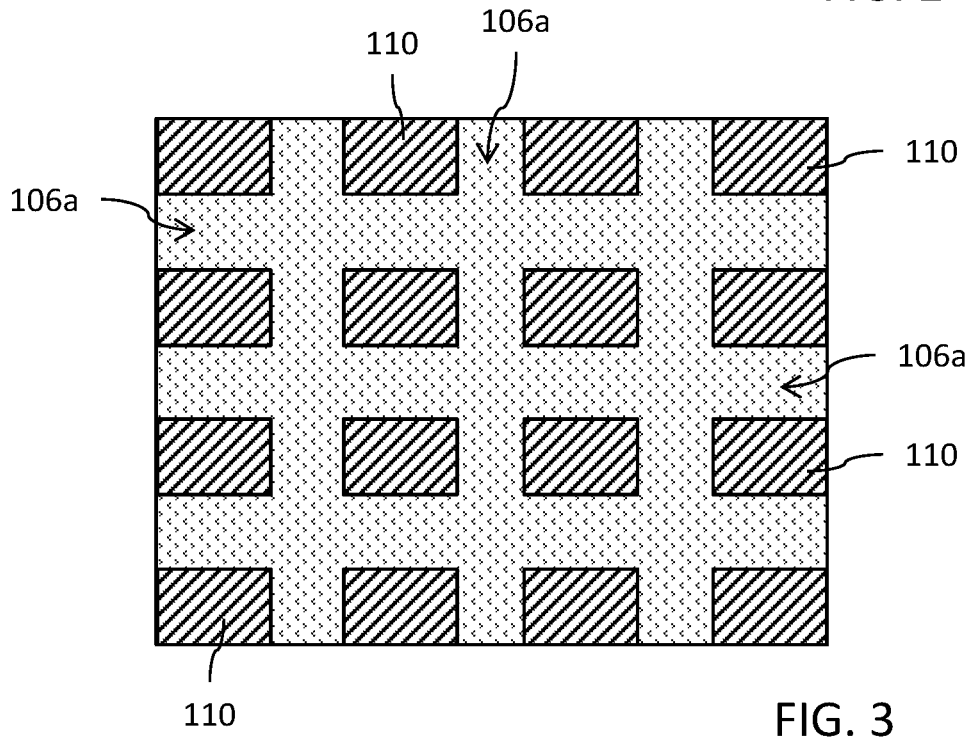
FIG. 3 is a plan view of the chip-sized integrated circuit package shown in FIG. 2.

A plan view showing the upper face of the chip-sized integrated circuit package 100 is shown in FIG. 3. It will be noted that the channels 106a separate the metal pads 110. The arrangement of the metal pads 110 in a regular array is preferred, but not necessarily required. The provision of the metal pads 110 as all having a same shape and area is an example implementation, and it will be understood that the arrangement of metal pads in terms of size and position is matter of design choice.

Figure 4:
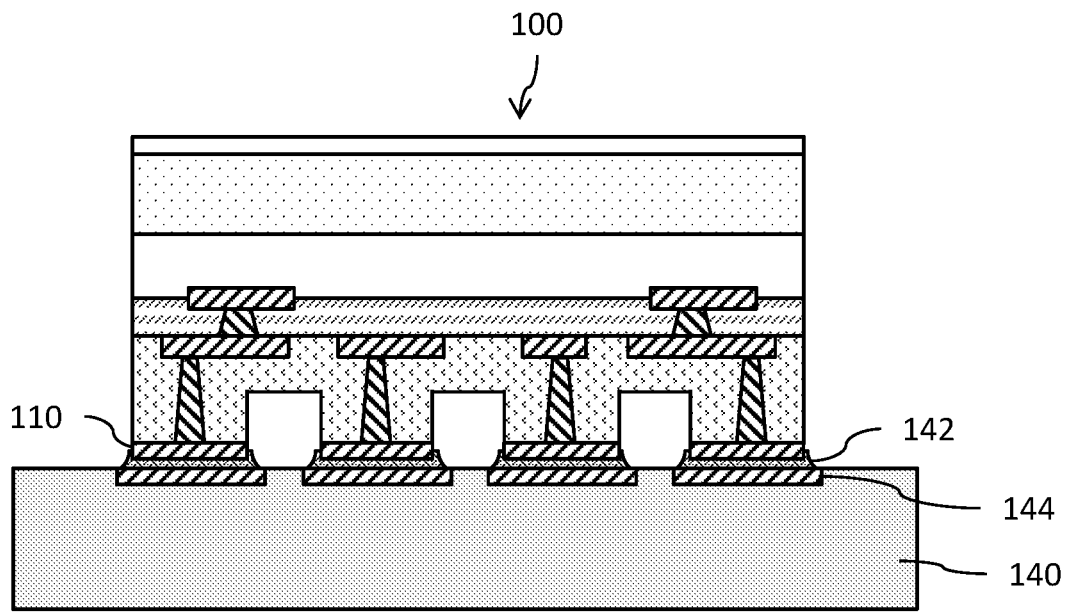
FIG. 4 illustrates mounting of the chip-sized integrated circuit package shown in FIG. 2 to a support substrate.

FIG. 4 illustrates the mounting of the chip-sized integrated circuit package 100 to a support substrate 140 (for example, a printed circuit board). Solder 142 connections are made between the metal pads 110 of the package 100 and metal pads 144 of the support substrate 140. It will be noted here that the pedestal regions 106b function as a standoff for spacing the integrated circuit die 102 away from the upper surface of the support substrate 140. The metal pads 110 form leads of a quad-flat no-lead (QFN) type package.

It will be noted that size and shape of the outer peripheral side edge of the package 100 is the same size and shape as the peripheral side edge of the integrated circuit die 102. The package 100 is according "chip-sized" having same width and length dimensions as the integrated circuit die 102. In this configuration, the die/package area ratio for the package 100 is equal to 1.

Figure 5:
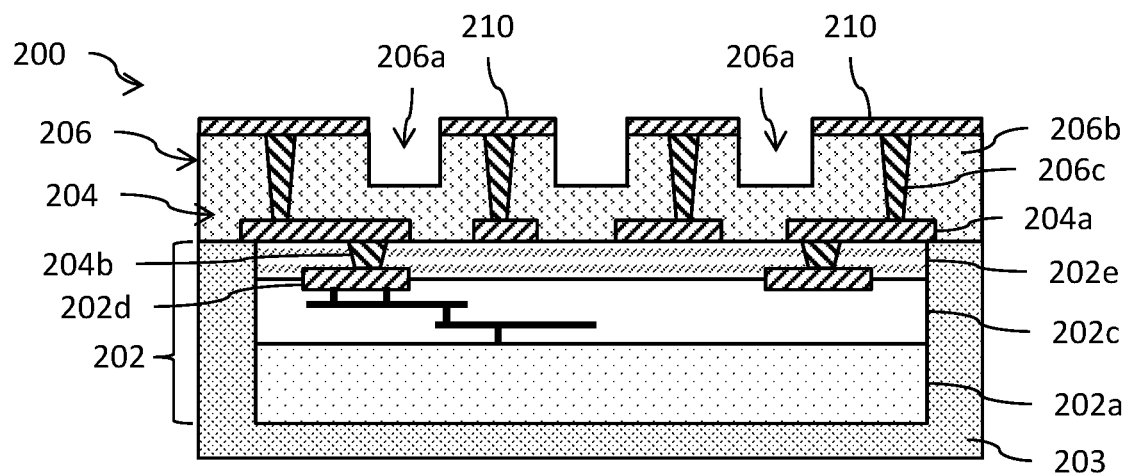
FIG. 5 shows a cross-sectional view of a chip-scaled integrated circuit package that does not utilize a leadframe.

Reference is made to FIG. 5 shows a cross-sectional view of a chip-scaled integrated circuit package 200 that does not utilize a leadframe. An integrated circuit die 202 includes a semiconductor (for example, silicon) substrate 202a having a front face and a rear face. The substrate 202a supports a plurality of integrated circuit devices such as transistors at the front face. An interconnect layer 202c extends over the front face of the substrate 202a. The interconnect layer 202c includes a plurality of metallization layers which support interconnection lines and interconnection vias as well as a plurality of bonding pads 202d. A passivation layer 202e covers the upper surface of the interconnect layer 202c and includes openings which expose the bonding pads 202d. The integrated circuit die 202 is encapsulated in an encapsulation body 203 which surrounds the outer peripheral side edges of the substrate 202a, the interconnect layer 202c and passivation layer 202e and covers the rear face of the substrate 202a. The upper surface of the passivation layer 202e is not covered by the encapsulation body 203. A conductive redistribution layer (RDL) 204 is supported by the upper (co-planar) surfaces of the passivation layer 202e and the encapsulation body 203. The RDL 204 includes conductive lines 204a extending on the passivation layer 202e and conductive vias 204b extending through the openings in the passivation layer 202e to make contact to the bonding pads 202d. A resin layer 206 covers the RDL 204, the passivation layer 202e and the encapsulation body 203. The resin layer 206 includes a plurality of channels 206a formed in the upper (i.e., front) surface. In a preferred implementation, the depth of the channels 206a from the upper surface is less than the thickness of the resin layer 206 (however, it will be noted that in alternative embodiments the depth of the channels 206a may pass completely through the resin layer 206 to reach the upper surface of the passivation layer 202e). The channels 206a delimit a plurality of pedestal (or stand-off) regions 206b in the resin layer 206. Each pedestal region 206b includes a through via 206c extending from an upper surface of the pedestal region 206b to reach and make contact with a portion of the RDL 204 (for example, along one of the conductive lines 204a). A metal pad 210 is formed at the upper surface of each pedestal region 206b in contact with the associated through via 206c.

Figure 6:
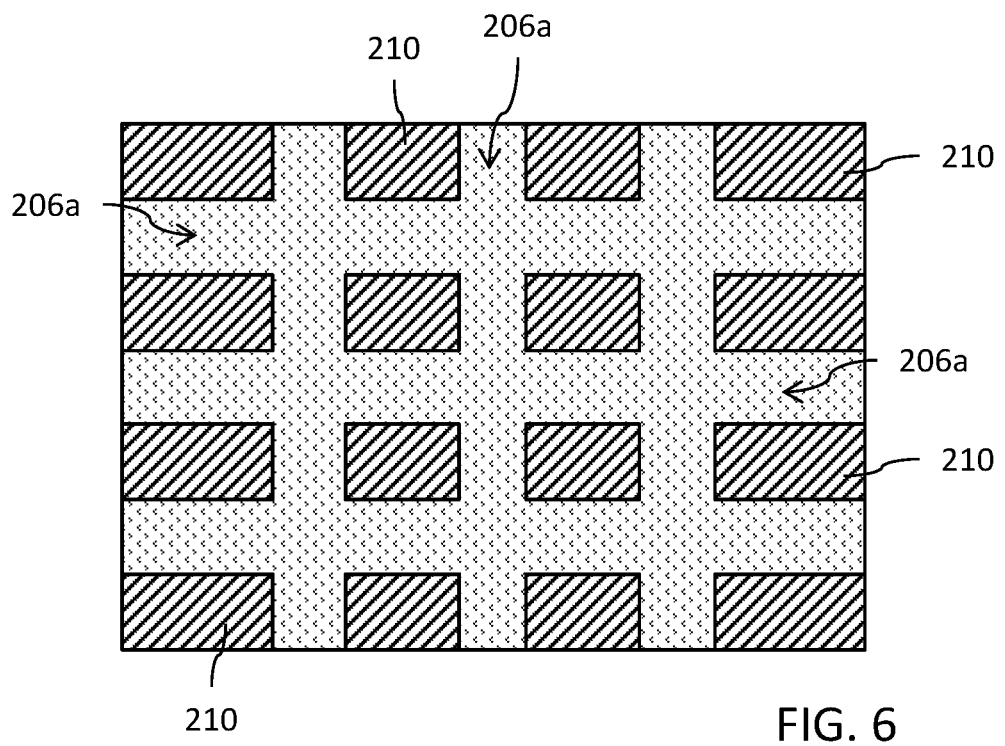
FIG. 6 is a plan view of the chip-scaled integrated circuit package shown in FIG. 5.

A plan view showing the upper face of the chip-sized integrated circuit package 200 is shown in FIG. 6. The arrangement of the metal pads 210 in a regular array is preferred, but not necessarily required. The provision of the metal pads 210 as all having a same shape and area is an example implementation, and it will be understood that the arrangement of metal pads in terms of size and position is matter of design choice.

Figure 7:
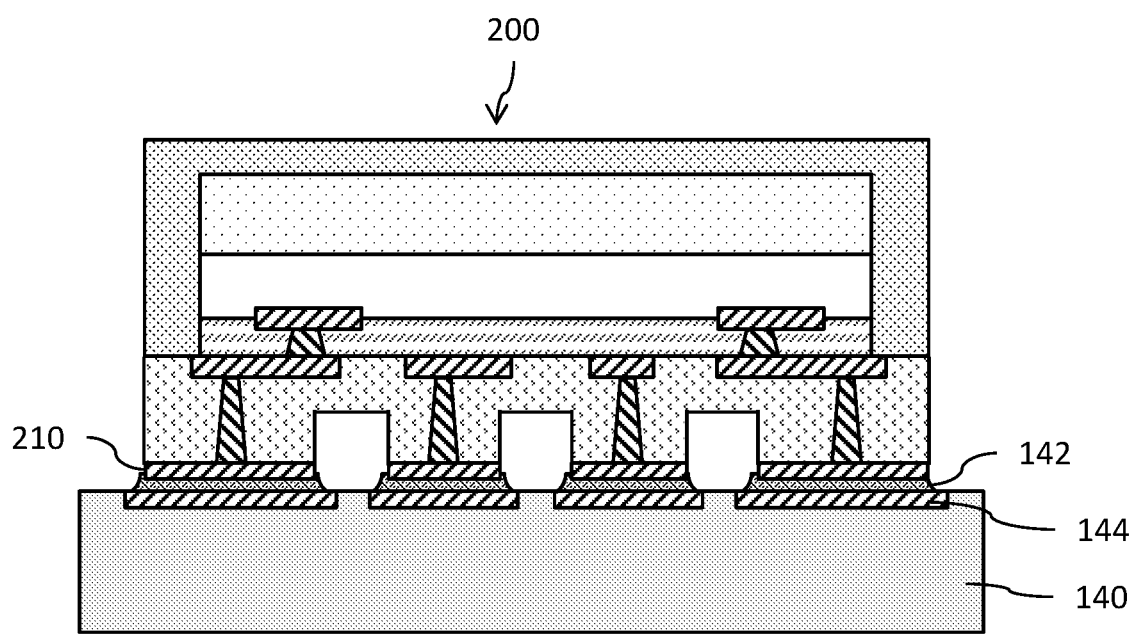
FIG. 7 illustrates mounting of the chip-scaled integrated circuit package shown in FIG. 5 to a support substrate.

FIG. 7 illustrates the mounting of the chip-sized integrated circuit package 200 to a support substrate 140 (for example, a printed circuit board). Solder 142 connections are made between the metal pads 210 of the package 200 and metal pads 144 of the support substrate 140. It will be noted here that the pedestal regions 206b function as a standoff for spacing the integrated circuit die 202 away from the upper surface of the support substrate 140. The metal pads 210 form leads of a quad-flat no-lead (QFN) type package.

It will be noted that the size and shape of outer peripheral side edge of the package 200 is larger than the size and shape of the peripheral side edge of the integrated circuit die 202. The package 200 is according "chip-scaled" having a larger width and length dimensions than the integrated circuit die 202. In this configuration, the die/package area ratio for the package 200 is very close to 1.

Reference is now made to FIGS. 8A-8J which show steps of a manufacturing process for fabricating the package 100.

Figure 8A:
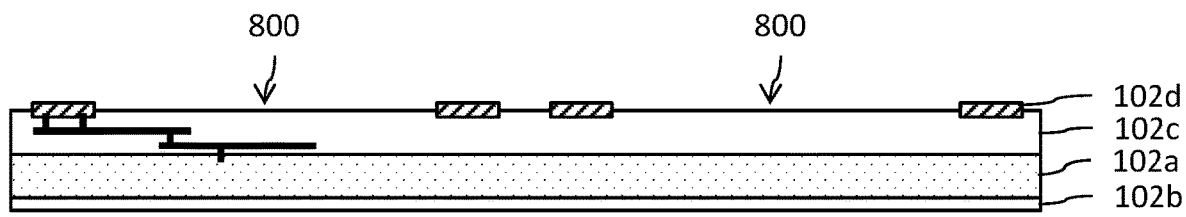
FIGS. 8A-8J show steps of a manufacturing process for fabricating the chip-sized integrated circuit package shown in FIG. 2.

FIG. 8A—a semiconductor wafer includes a semiconductor substrate layer 102a having a front face and a rear face. The wafer includes a plurality of integrated circuit regions 800 each of which supports a plurality of integrated circuit devices such as transistors at the front face of the semiconductor layer 102a. An insulating coating layer 102b is mounted to the rear face of the wafer. An interconnect layer 102c extends over the front face of the substrate 102a. The interconnect layer 102c includes a plurality of metallization layers which support interconnection lines and interconnection vias as well as a plurality of bonding pads 102d.

Figure 8B:
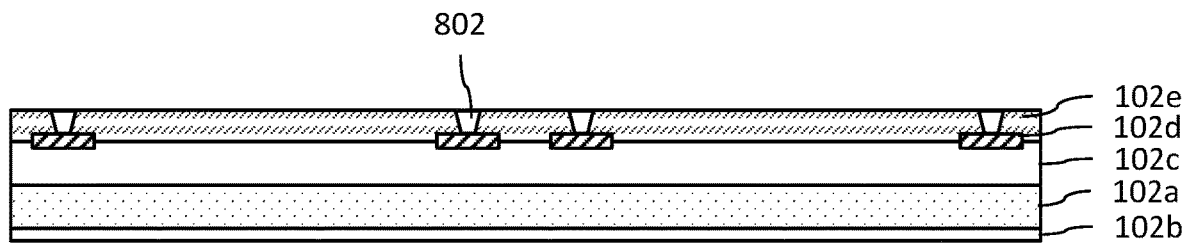

FIG. 8B—a passivation layer 102e is formed over the semiconductor wafer to cover the interconnect layer 102c. Openings 802 in the passivation layer 102e expose the bonding pads 102d.

Figure 8C:
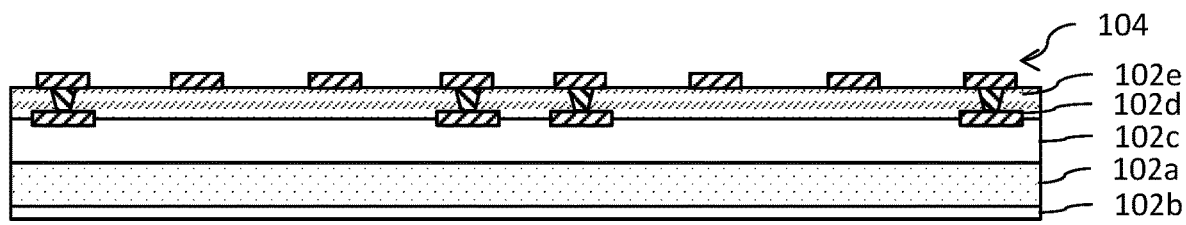

FIG. 8C—the conductive redistribution layer (RDL) 104 is then formed on the passivation layer 102e. The RDL 104 includes conductive lines and conductive vias (which fill the openings 802). The RDL 104 may be formed, for example, using a deposition of a blanket metal layer followed by a lithographic patterning.

Figure 8D:
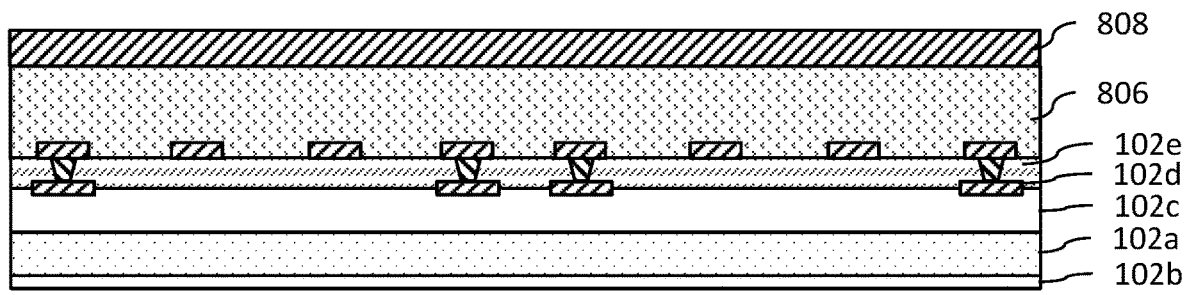

FIG. 8D—a stack including a resin layer 806 and a conductive layer 808 is then laminated to the RDL 104 and passivation layer 102e. Conductive layer 808 may, for example, be made of copper or an alloy which includes copper.

Figure 8E:
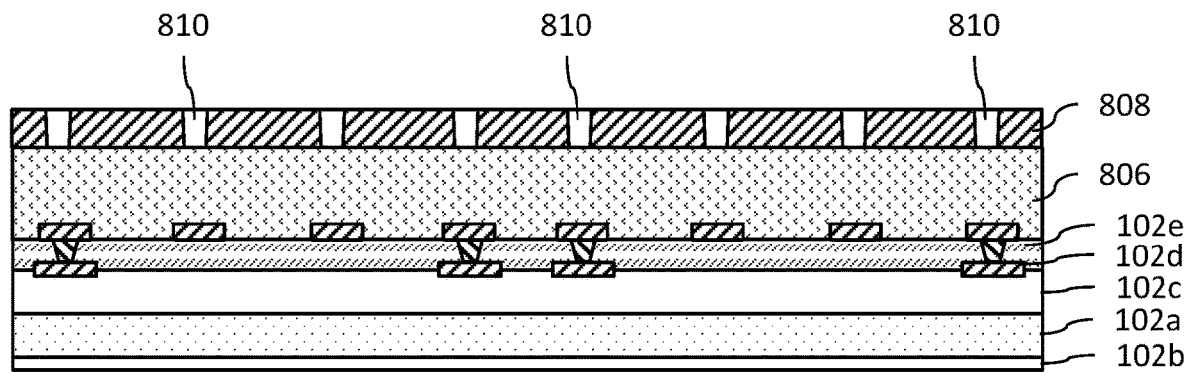

FIG. 8E—openings 810 are then formed to extend through the conductive layer 808. The openings 810 may be formed, for example, using a laser drilling process.

Figure 8F:
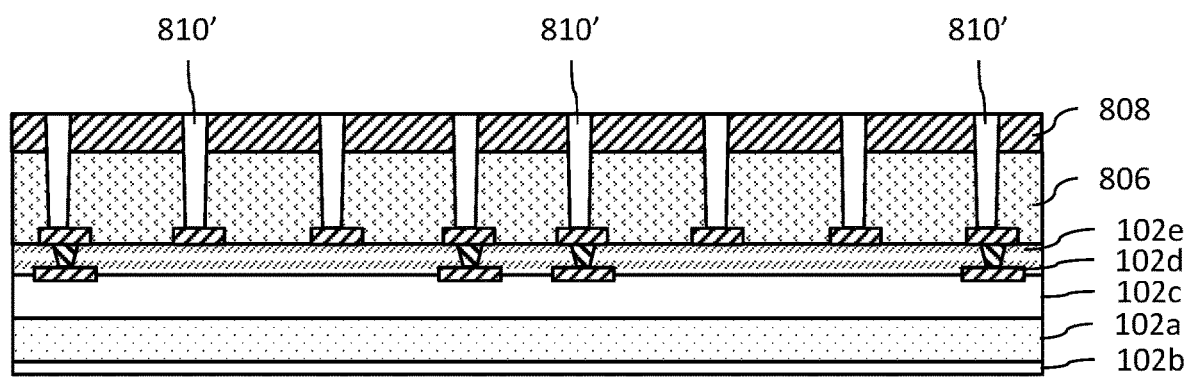

FIG. 8F—the openings 810' are then extended to pass through the resin layer 806 and reach the RDL 104. The extension of the openings 810' in the resin layer 806 may be formed, for example, using a plasma etching process.

Figure 8G:
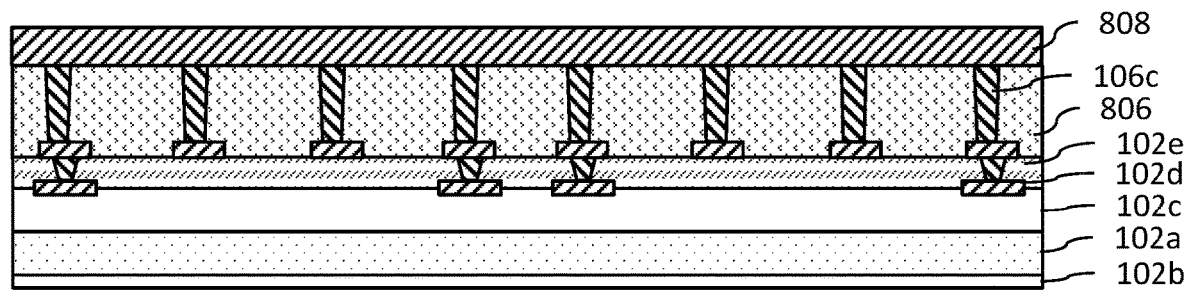

FIG. 8G—a plating process is then used to fill the openings 810' with conductive material which forms the through vias 106c.

Figure 8H:
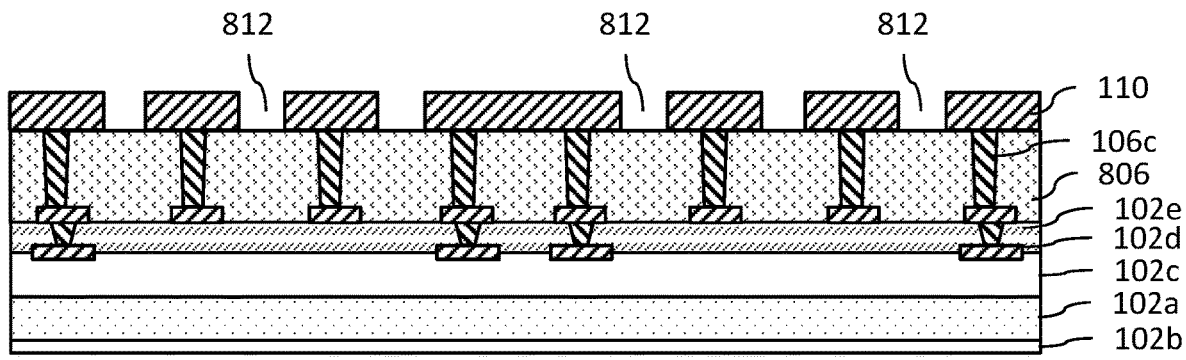

FIG. 8H—the conductive layer 808 is then lithographically patterned to form the metal pads 110. Conventional masking and etching processes can be used to pattern the conductive layer 808 by forming openings 812 extending through the conductive layer 808.

Figure 8I:
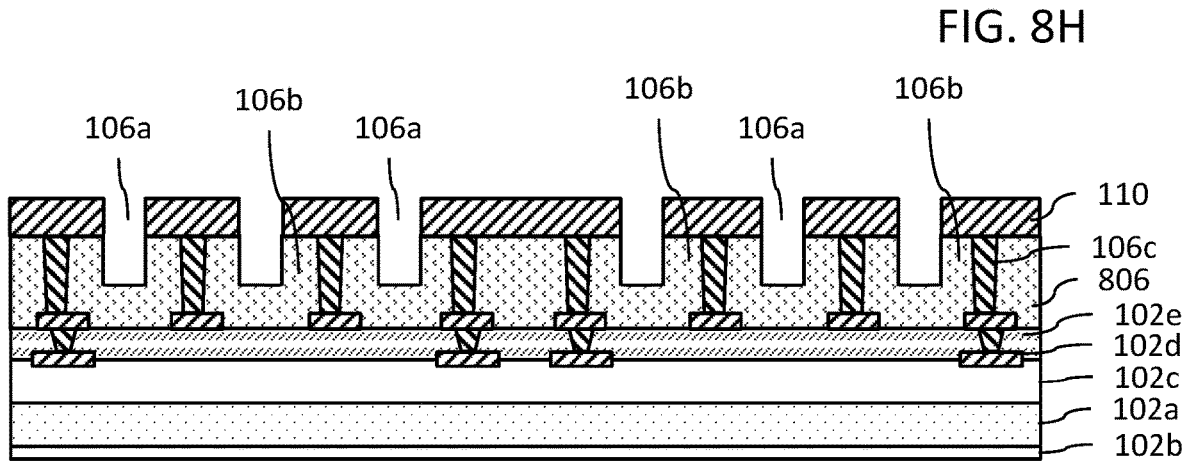

FIG. 8I—trenches 106a (aligned with the openings 812) are then formed in the resin layer 806 to define the pedestal regions 106b. Any suitable plasma etching process can used to form the trenches 106a while using the lithographically patterned metal pads 110 and openings 812 as an etch mask.

Figure 8J:
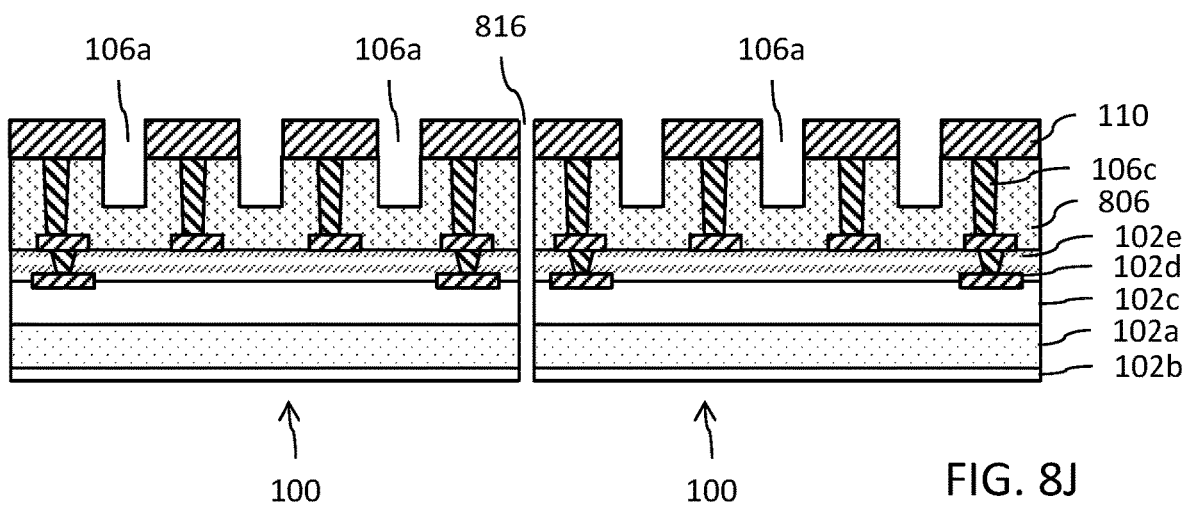

FIG. 8J—a conventional wafer singulation process is then performed to dice the wafer into a plurality of packages 100. Singulation may be accomplished using a sawing process along scribe lines 816.

Figure 9A:
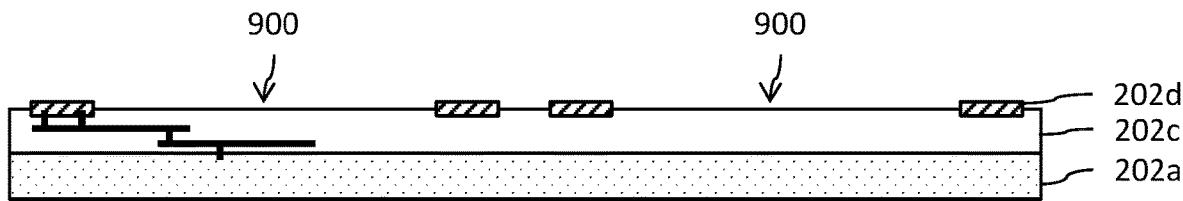
FIGS. 9A-9N show steps of a manufacturing process for fabricating the chip-scaled integrated circuit package shown in FIG. 5.
Figure 9B:
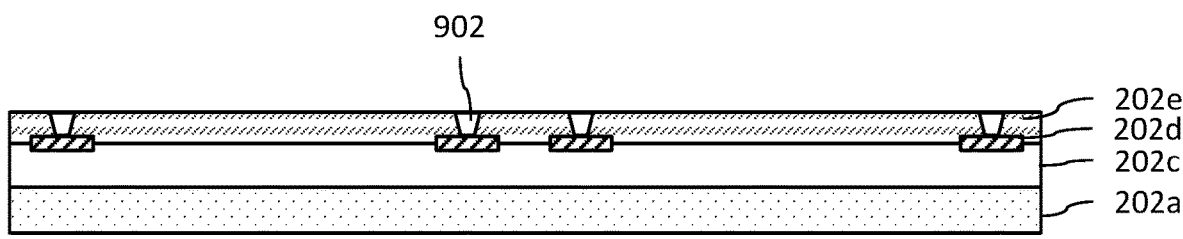
Figure 9C:
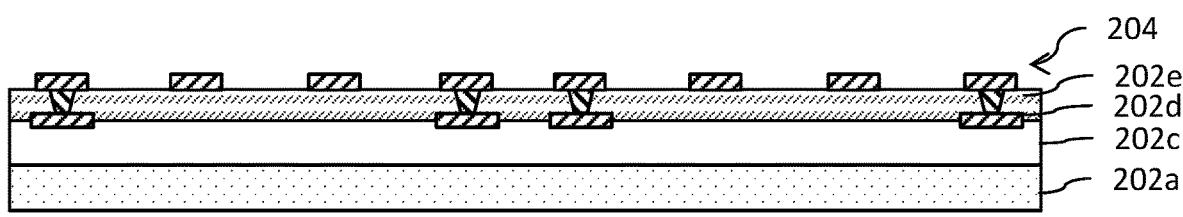
Figure 9D:
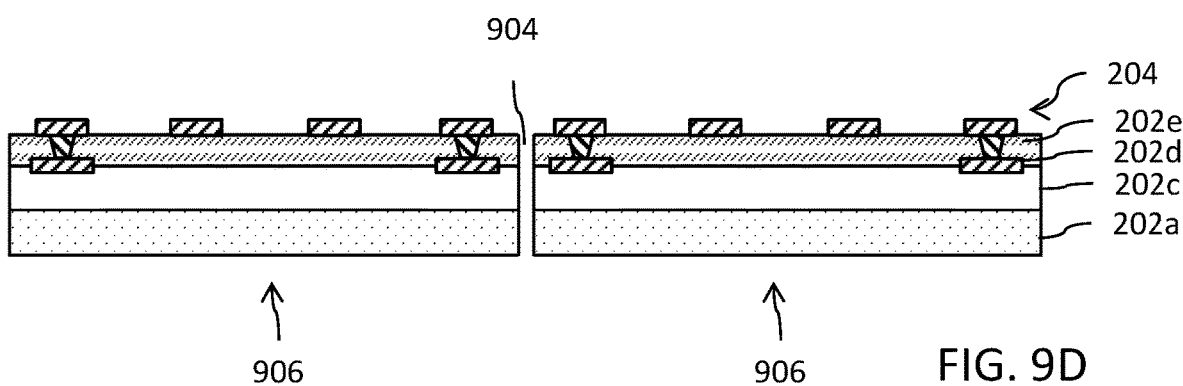
Figure 9E:
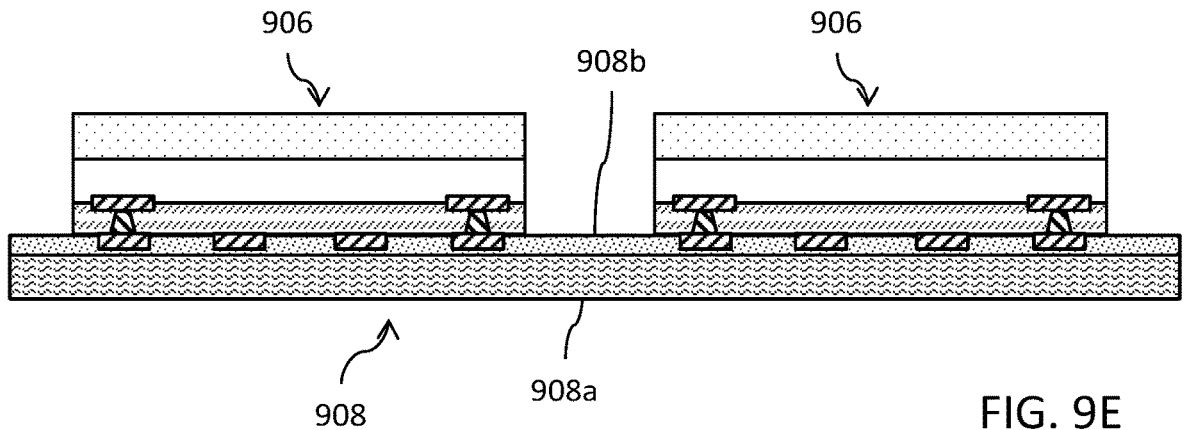
Figure 9F:
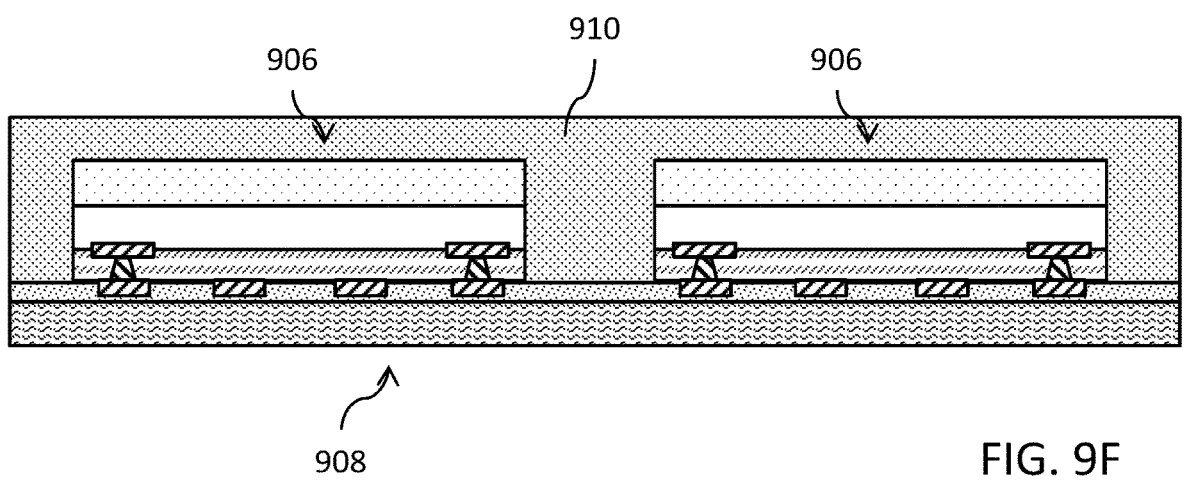
Figure 9G:
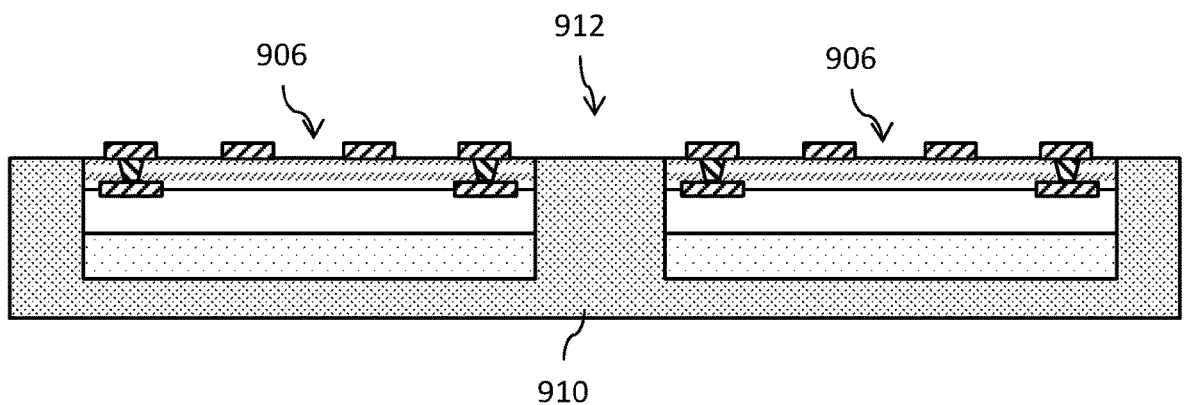
Figure 9H:
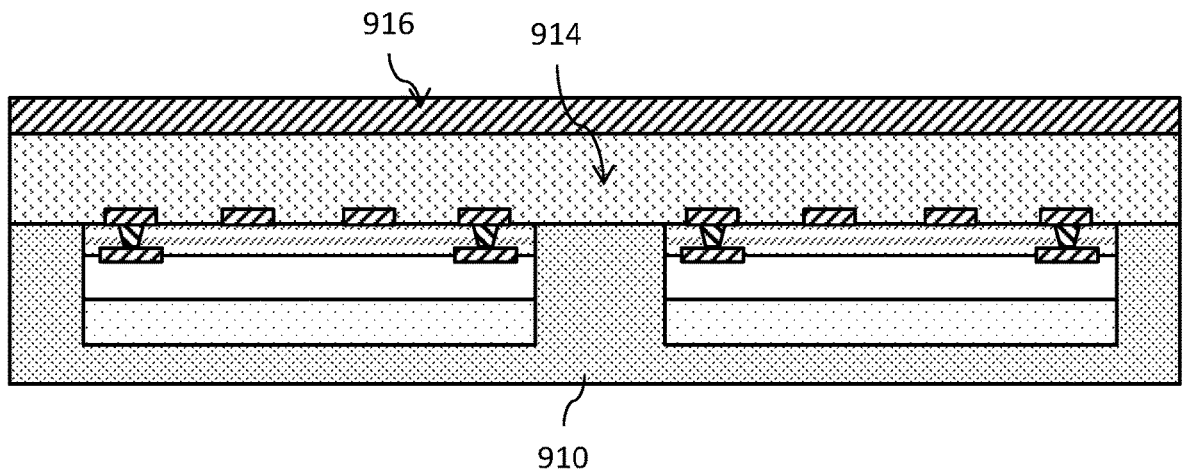
Figure 9I:
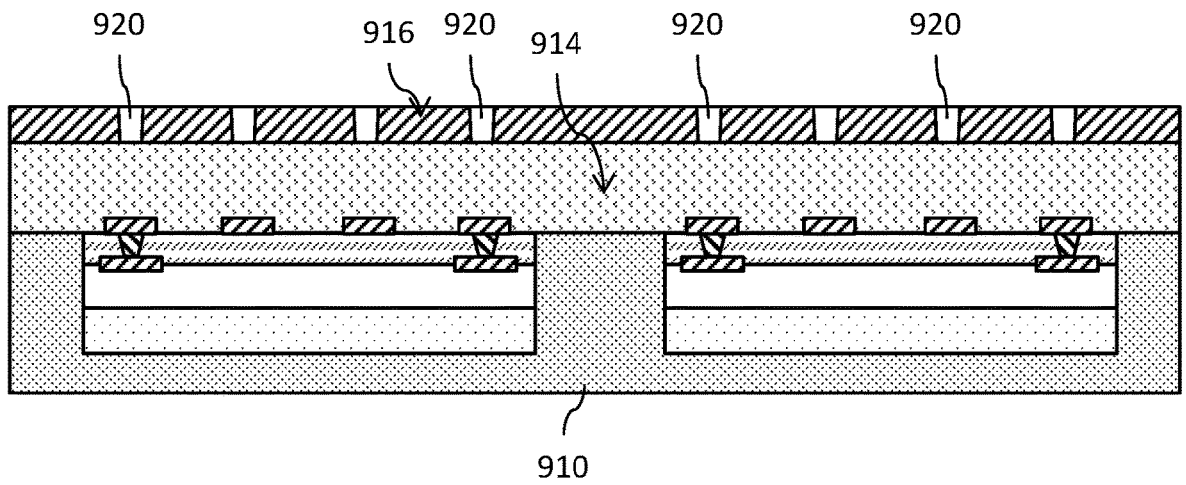
Figure 9J:
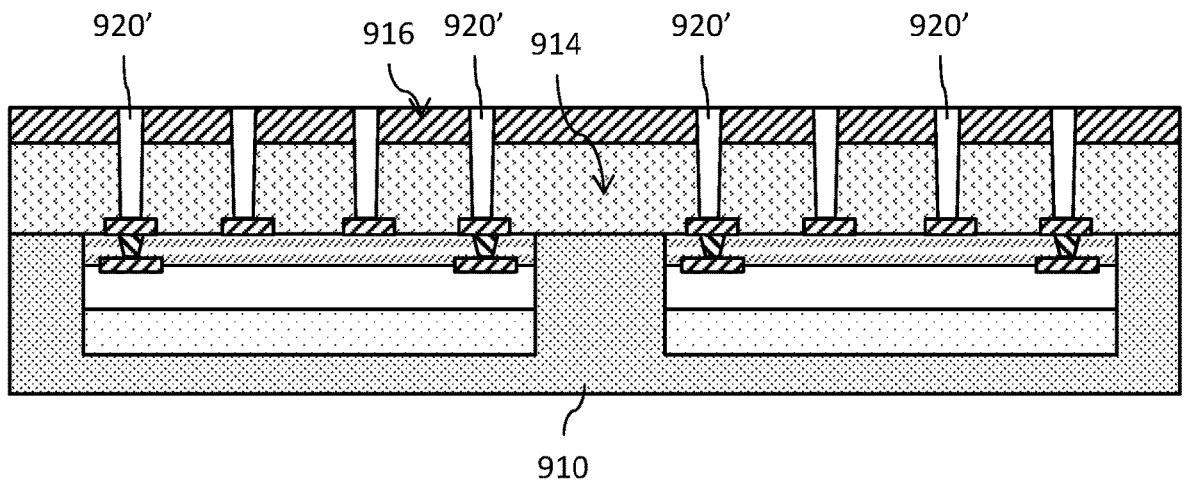
Figure 9K:
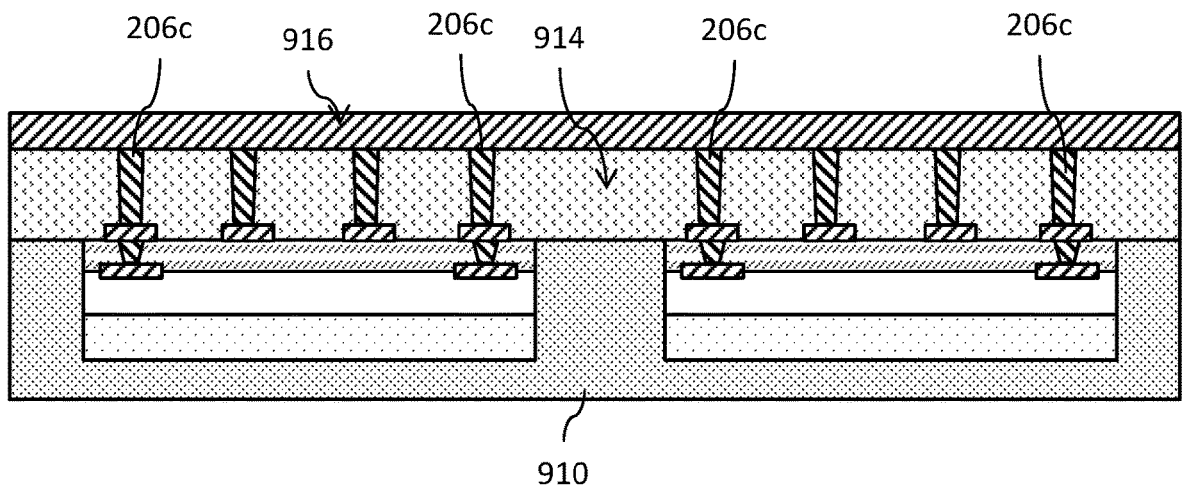
Figure 9L:
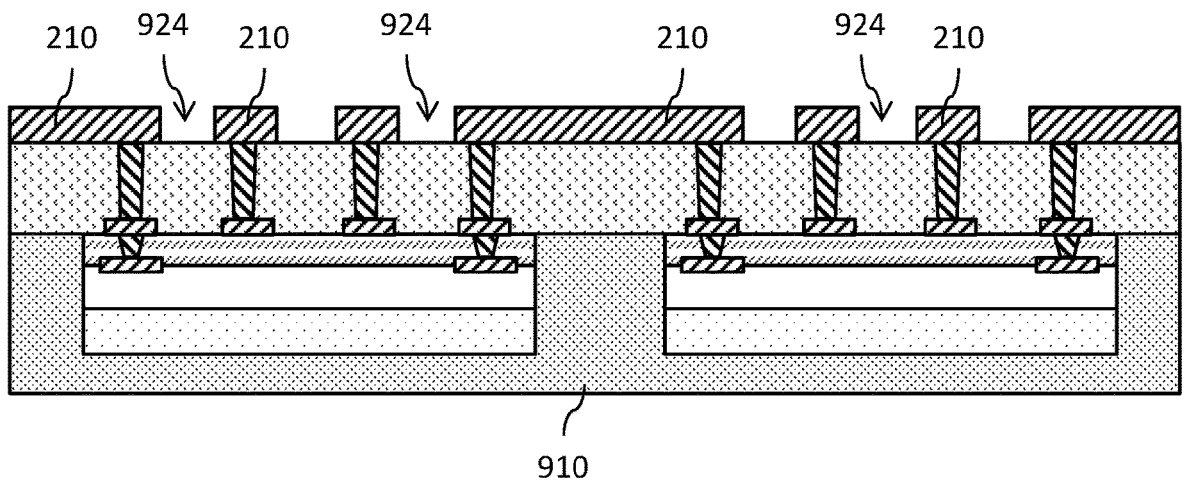
Figure 9M:
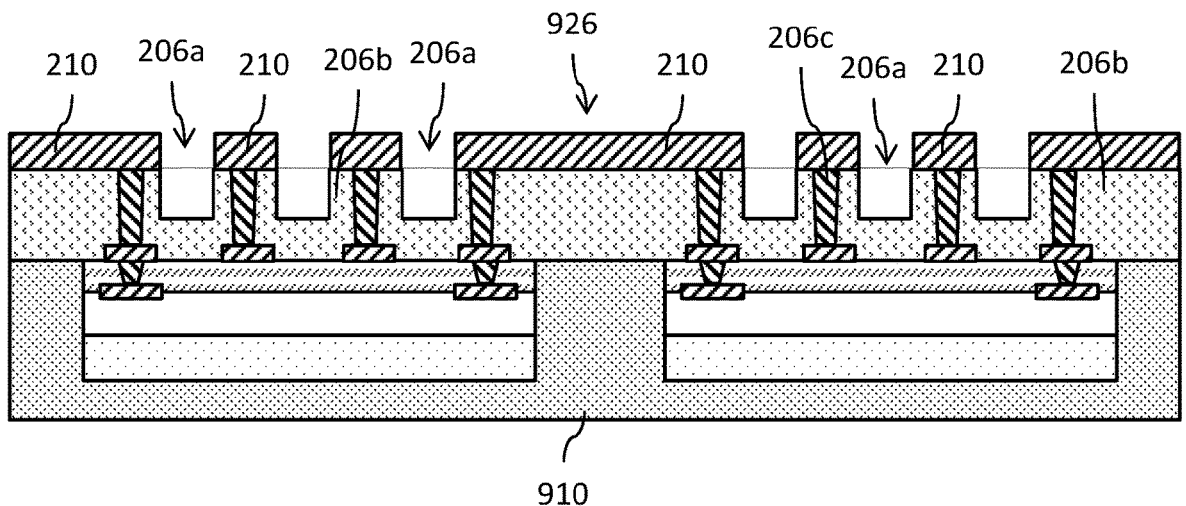
Figure 9N:
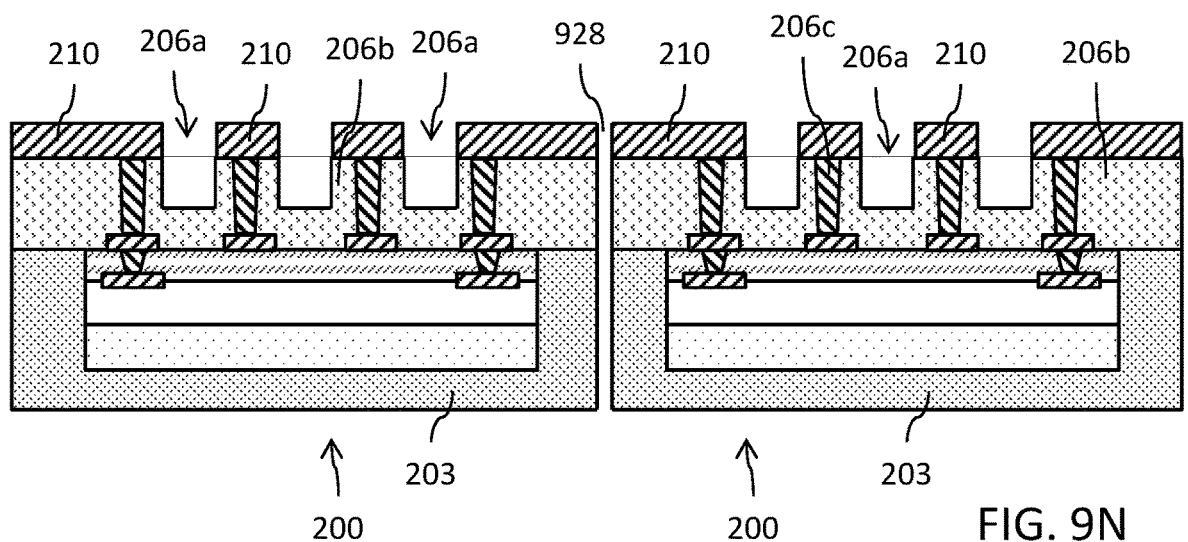

Reference is now made to FIGS. 9A-9N which show steps of a manufacturing process for fabricating the package 200.

FIG. 9A—a semiconductor wafer includes a semiconductor substrate layer 202a having a front face and a rear face. The wafer includes a plurality of integrated circuit regions 900 each of which supports a plurality of integrated circuit devices such as transistors at the front face of the semiconductor layer 202a. An interconnect layer 202c extends over the front face of the substrate 202a. The interconnect layer 202c includes a plurality of metallization layers which support interconnection lines and interconnection vias as well as a plurality of bonding pads 202d.

FIG. 9B—a passivation layer 202e is formed over the semiconductor wafer to cover the interconnect layer 202c. Openings 902 in the passivation layer 202e expose the bonding pads 202d.

FIG. 9C—the conductive redistribution layer (RDL) 204 is then formed on the passivation layer 202e. The RDL 204 includes conductive lines and conductive vias (which fill the openings 902). The RDL 204 may be formed, for example, using a deposition of a blanket metal layer followed by a lithographic patterning.

FIG. 9D—a conventional wafer singulation process is then performed to dice the wafer into a plurality of integrated circuit chips 906. Singulation may be accomplished using a sawing process along scribe lines 904.

FIG. 9E—the individual integrated circuit chips 906 are then flipped upside down and mounted to a chip carrying panel 908. The panel 908 is formed by a rigid support layer 908a and a compressible layer 908b that conforms to and surrounds the RDL 204.

FIG. 9F—a molding process is then performed to mold an encapsulating material 910 around each of the integrated circuit chips 906.

FIG. 9G—the chip carrying panel 908 is then removed and the structure 912 formed by the integrated circuit chips 906 encapsulated by the encapsulating material 910 is flipped upside down.

FIG. 9H—a stack including a resin layer 914 and a conductive layer 916 is then laminated to the RDL 204 and passivation layer 202e. Conductive layer 916 may, for example, be made of copper or an alloy which includes copper.

FIG. 9I—openings 920 are then formed to extend through the conductive layer 916. The openings 920 may be formed, for example, using a laser drilling process.

FIG. 9J—the openings 920' are then extended to pass through the resin layer 914 and reach the RDL 204. The extension of the openings 920' in the resin layer 914 may be formed, for example, using a plasma etching process.

FIG. 9K—a plating process is then used to fill the openings 920' with conductive material which forms the through vias 206c.

FIG. 9L—the conductive layer 916 is then lithographically patterned to form the metal pads 210. Conventional masking and etching processes can be used to pattern the conductive layer 916 by forming openings 924 extending through the conductive layer 916.

FIG. 9M—trenches 206a (aligned with openings 924) are then formed in the resin layer 914 to define the pedestal regions 206b. Any suitable plasma etching process can used to form the trenches 206a in the structure 926 while using the lithographically patterned metal pads 210 and openings 924 as an etch mask.

FIG. 9N—a conventional wafer singulation process is then performed to dice the structure 926 into a plurality of packages 200. Singulation may be accomplished using a sawing process along scribe lines 928.

Figure 1:
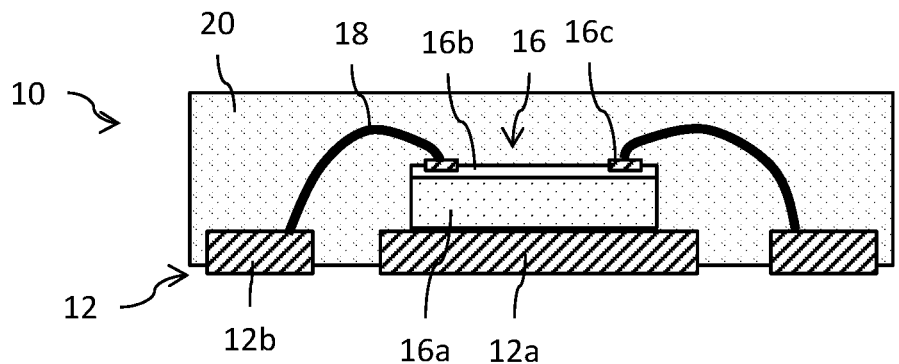
FIG. 1 shows a cross-sectional view of a convention integrated circuit package.

The packages 100 and 200 present a number of advantages over conventional package designs which utilize a leadframe (see, FIG. 1, for example). There is a high die/package area ratio which can be equal to 1 for the package 100 and very close to 1 for the package 200. There is a high temperature cycling on board (TCOB) characteristic and higher package reliability for the packages 100, 200 due to the thick copper pad 110, 210 and the use of the pedestal 106b, 206b as a standoff. The packages 100 and 200 also advantageously present a low profile when mounted. The packages 100 and 200 further support improved thermal and electrical performance.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit package without leadframe, comprising:
   an integrated circuit die including: a semiconductor substrate having a front face; an interconnect layer extending over the front face of the semiconductor substrate; wherein the interconnect layer includes a plurality of bonding pads; and a passivation layer covering an upper surface of the interconnect layer and including openings in the passivation layer on the plurality of bonding pads;
   a conductive redistribution layer supported by an upper surface of the passivation layer, said conductive redistribution layer including conductive lines extending on the passivation layer and conductive vias extending through the openings in the passivation layer to make contact to the plurality of bonding pads;
   an insulating layer covering the conductive redistribution layer and the passivation layer, wherein the insulating layer includes a plurality of channels in an upper surface of the insulating layer to delimit a plurality of pedestal regions in the insulating layer;
   a through via extending from an upper surface of and through each pedestal region of the plurality of the pedestal regions and through the insulating layer to reach and make contact with a portion of the conductive redistribution layer; and
   a metal pad on the upper surface of the pedestal region and in contact with the through via.

2. The integrated circuit package of claim 1, wherein the insulating layer is made of a resin material.

3. The integrated circuit package of claim 1, wherein a die/package area ratio is equal to 1.

4. The integrated circuit package of claim 1, wherein a depth of each channel of said plurality of channels is less than a thickness of the insulating layer.

5. The integrated circuit package of claim 1, further comprising a protection layer on a back face of the semiconductor substrate.

6. The integrated circuit package of claim 1, further comprising an encapsulating body surrounding side edges and a back face of the semiconductor substrate.

7. The integrated circuit package of claim 6, wherein a die/package area ratio with said encapsulating body is close to 1.

8. The integrated circuit package of claim 1, wherein said metal pad forms a lead of a quad-flat no-lead (QFN) type package.

9. An integrated circuit package without leadframe, comprising:
   an integrated circuit die having a front surface including a plurality of bonding pads and a passivation layer;
   a conductive redistribution layer over the passivation layer and in electrical connection to said plurality of bonding pads;
   an insulating layer over the conductive redistribution layer, wherein the insulating layer includes a plurality of channels that delimit a plurality of pedestal regions;
   a through via extending through each pedestal region of the plurality of pedestal regions to reach and make contact with the conductive redistribution layer; and
   a metal pad on an upper surface of each pedestal region of the plurality of pedestal regions and in contact with the through via.

10. The integrated circuit package of claim 9, wherein a depth of each channel of said plurality of channels is less than a thickness of the insulating layer.

11. The integrated circuit package of claim 9, wherein said metal pad forms a lead of a quad-flat no-lead (QFN) type package.

12. An integrated circuit package without leadframe, comprising:
   an integrated circuit die having a front surface including a plurality of bonding pads and a passivation layer;
   an encapsulating body surrounding sides and a back surface of the integrated circuit die;
   a conductive redistribution layer over the passivation layer and in electrical connection to said plurality of bonding pads;
   an insulating layer over the conductive redistribution layer and the encapsulating body, wherein the insulating layer includes a plurality of channels that delimit a plurality of pedestal regions;
   a through via extending through each pedestal region of the plurality of pedestal regions to reach and make contact with the conductive redistribution layer; and
   a metal pad on an upper surface of each pedestal region and in contact with the through via.

13. The integrated circuit package of claim 12, wherein a depth of each channel of said plurality of channels is less than a thickness of the insulating layer.

14. The integrated circuit package of claim 12, wherein said metal pad forms a lead of a quad-flat no-lead (QFN) type package.

* * * * *